(12) United States Patent
Beng et al.

(10) Patent No.: US 12,477,870 B2
(45) Date of Patent: Nov. 18, 2025

(54) SURFACE MOUNTABLE OPTOELECTRONIC DEVICE WITH SIDE WALLS INCLUDING SLOTS FILLED WITH A LAMINATED ENCAPSULANT MATERIAL

(71) Applicant: Dominant Opto Technologies Sdn Bhd., Melaka (MY)

(72) Inventors: Low Tek Beng, Melaka (MY); Lim Chee Sheng, Melaka (MY)

(73) Assignee: DOMINANT OPTO TECHNOLOGIES SDN BHD., Melaka (MY)

( * ) Notice: Subject to any disclaimer, the term of this patent is extended or adjusted under 35 U.S.C. 154(b) by 607 days.

(21) Appl. No.: 17/834,862

(22) Filed: Jun. 7, 2022

(65) Prior Publication Data

US 2023/0327056 A1 Oct. 12, 2023

(30) Foreign Application Priority Data

Apr. 7, 2022 (MY) .......................... PI 2022001857

(51) Int. Cl.
*H10H 20/85* (2025.01)
*H01L 23/04* (2006.01)
(Continued)

(52) U.S. Cl.
CPC ...... *H10H 20/8506* (2025.01); *H10H 20/853* (2025.01); *H10H 20/857* (2025.01);
(Continued)

(58) Field of Classification Search
CPC ... H01L 23/041; H01L 23/043; H01L 23/055; H01L 23/057; H10H 20/8502;
(Continued)

(56) References Cited

U.S. PATENT DOCUMENTS 6,599,768 B1 * 7/2003 Chen ...................... H01L 24/97
438/22
8,395,181 B2 * 3/2013 Cho ...................... H10H 20/855
257/98

(Continued)

FOREIGN PATENT DOCUMENTS

CN          114038763 A  *  2/2022
JP          2016127145     *  7/2016

*Primary Examiner* — David A Zarneke
(74) *Attorney, Agent, or Firm* — Amin, Turocy & Watson, LLP

(57) ABSTRACT

A surface mountable optoelectronic device with side walls including slots filled with a laminated encapsulant material is presented herein. A surface mount technology (SMT) optoelectronic device includes a substrate, a housing, at least one optoelectronic chip, and an encapsulant material. The substrate includes electrical terminals that facilitate attachment and electrical coupling of the SMT optoelectronic device to a printed circuit board. The housing includes an opaque material and a cavity, in which the substrate is positioned at a bottom portion of the cavity, and a top portion of the housing includes a group of slot openings. The at least one optoelectronic chip is electrically connected to the electrical terminals, and is mounted, within the cavity, to the substrate. The encapsulant material is translucent or transparent, and has been included in the cavity and the slot openings.

20 Claims, 9 Drawing Sheets

(51) Int. Cl.
*H01L 23/043* (2006.01)
*H01L 23/053* (2006.01)
*H10H 20/01* (2025.01)
*H10H 20/853* (2025.01)
*H10H 20/857* (2025.01)

(52) U.S. Cl.
CPC .......... *H01L 23/041* (2013.01); *H01L 23/043* (2013.01); *H01L 23/053* (2013.01); *H10H 20/0362* (2025.01); *H10H 20/0364* (2025.01)

(58) Field of Classification Search
CPC .......... H10H 20/8504; H10H 20/8506; H10H 20/8508; H10F 77/50
See application file for complete search history.

(56) References Cited

U.S. PATENT DOCUMENTS

| | | | |
|---|---|---|---|
| 8,525,213 B2* | 9/2013 | Park | H10H 20/8506 257/E33.059 |
| 8,723,211 B2* | 5/2014 | Kirsch | H10H 20/8506 257/E33.059 |
| 9,893,250 B1* | 2/2018 | Ichikawa | H01L 23/3121 |
| 9,933,560 B2* | 4/2018 | Oh | H10H 20/8506 |
| 10,672,715 B2* | 6/2020 | Kweon | H01L 24/96 |
| 2015/0001573 A1* | 1/2015 | Park | H10H 20/8506 257/99 |
| 2018/0026169 A1* | 1/2018 | Shioji | C23C 14/3464 257/98 |
| 2018/0123000 A1* | 5/2018 | Suzuki | H10H 20/8512 |
| 2019/0211986 A1* | 7/2019 | Tokida | H10H 20/80 |
| 2021/0320232 A1* | 10/2021 | Tangring | H10H 20/856 |
| 2022/0262997 A1* | 8/2022 | Ukawa | H01L 25/167 |

* cited by examiner

600

610

LAMINATING AN ENCAPSULANT SHEET COMPRISING A PLIABLE MATERIAL TO THE HOUSING FRAME, IN WHICH THE LAMINATING COMPRISES FILLING THE RESPECTIVE CAVITIES AND THE SLOT OPENINGS WITH THE PLIABLE MATERIAL

620

DICING THE SMT OPTOELECTRONIC DEVICES IN TO DISCRETE SMT OPTOELECTRONIC DEVICES

700 ⟶

710 ⟶ SEPARATING, VIA SAWING, THE RESPECTIVE PORTIONS INTO RESPECTIVE PAIRS OF SUBSTRATES, IN WHICH THE SAWING CREATES RESPECTIVE GAPS BETWEEN THE RESPECTIVE PAIRS OF SUBSTRATES, AND IN WHICH EACH PAIR OF SUBSTRATES OF THE RESPECTIVE PAIRS OF SUBSTRATES CORRESPONDS TO AN SMT OPTOELECTRONIC DEVICE OF THE SMT OPTOELECTRONIC DEVICES

FIG. 7

SURFACE MOUNTABLE OPTOELECTRONIC DEVICE WITH SIDE WALLS INCLUDING SLOTS FILLED WITH A LAMINATED ENCAPSULANT MATERIAL

RELATED APPLICATION

The subject patent application claims priority under 35 U.S.C. § 119 to Malaysia Pat. App. No. PI 2022001857, filed Apr. 7, 2022, and entitled "SURFACE MOUNTABLE OPTOELECTRONIC DEVICE WITH SIDE WALLS INCLUDING SLOTS FILLED WITH A LAMINATED ENCAPSULANT MATERIAL" the entirety of which application is hereby incorporated by reference herein.

TECHNICAL FIELD

The subject disclosure generally relates to embodiments for a surface mountable optoelectronic device with side walls including slots filled with a laminated encapsulant material.

BACKGROUND

Conventional LED technologies utilize LED packages that have housings. After an LED device is placed within a housing of an LED package, a viscous material is poured, injected, etc. into the housing and cured. Stress that has been applied to the LED package via, e.g., a change in temperature, a movement, a force, and/or a strain can cause cracks and other deformations of the LED package—negatively affecting optical properties, e.g., color and/or brightness, of the LED device. Further, such stress can cause delamination and/or separation of a cured material from the housing, and/or cause a loss of electrical contact of the LED device.

In this regard, conventional LED technologies have had some drawbacks, some of which may be noted with reference to the various embodiments described herein below.

BRIEF DESCRIPTION OF THE DRAWINGS

Non-limiting embodiments of the subject disclosure are described with reference to the following figures, wherein like reference numerals refer to like parts throughout the various views unless otherwise specified:

FIGS. 5-7 illustrate a method of manufacturing SMT optoelectronic devices via a lamination process, in accordance with various example embodiments;

DETAILED DESCRIPTION

Figure 1:
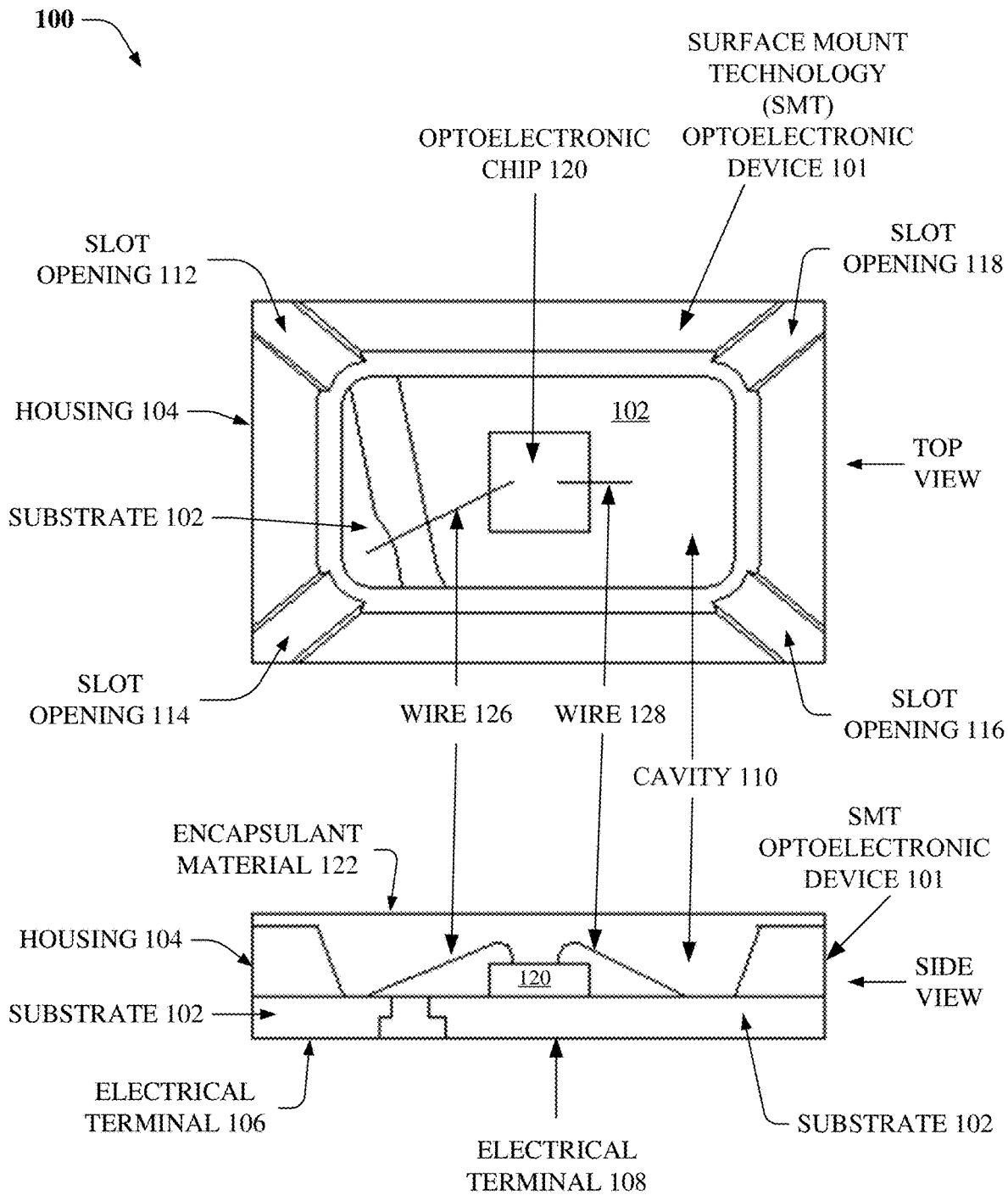
FIG. 1 illustrates a block diagram of top and side views of a surface mount technology (SMT) optoelectronic device comprising slots at corners of a housing of the SMT optoelectronic device, in which the slots and a cavity within the housing are filled with a laminated encapsulant material, in accordance with various example embodiments.

Aspects of the subject disclosure will now be described more fully hereinafter with reference to the accompanying drawings in which example embodiments are shown. In the following description, for purposes of explanation, numerous specific details are set forth in order to provide a thorough understanding of the various embodiments. However, the subject disclosure may be embodied in many different forms and should not be construed as limited to the example embodiments set forth herein.

As described above, conventional LED technologies have had some drawbacks with respect to stress (e.g., temperature, movement, force, and/or strain) that has been applied to an LED device—the stress causing cracks and/or deformation of the LED device; delamination and/or separation of a material that has been included in a housing of the LED device; and/or loss of electrical contact(s) within the LED device. Such stress negatively affecting optical properties (e.g., color, brightness, light emission) of the LED device.

On the other hand, various embodiments disclosed herein can prevent and/or reduce cracks, deformation, delamination, separation, and/or loss of electrical contact(s), e.g., associated with stress that has been applied to an LED device, by including slots in a top portion of a housing of the LED device and filling the slots and a cavity of the housing with a laminated encapsulant material.

For example, an SMT optoelectronic device comprises: a substrate comprising electrical terminals that facilitate attachment and electrical coupling of the SMT optoelectronic device to a printed circuit board (PCB); a housing comprising an opaque material and a cavity, in which the substrate is positioned at a bottom portion of the cavity, and a top portion of the housing comprises a group of slot openings; at least one optoelectronic chip that is electrically connected to the electrical terminals and mounted, within the cavity, to the substrate; and an encapsulant material that is translucent or transparent and that has been included in the cavity and the slot openings.

In embodiment(s), the housing has been formed, via an applied defined pressure and an applied defined heat, from a pellet based and/or plastic material. In other embodiment(s), the encapsulant material has been formed, via a sheet lamination process, in the cavity and the slot openings. In yet other embodiment(s), the encapsulant material comprises a sheet of pliable material that has been softened, e.g., via heat, into a viscous material that fills the group of slot openings and the cavity, and then hardened during the sheet lamination process, e.g., via a curing process corresponding to a defined heat and/or a defined pressure that has been applied to the SMT optoelectronic devices.

In other embodiment(s), a method of manufacturing SMT optoelectronic devices comprises: forming a lead frame comprising a group of substrates that are adjacent to respective substrates of the group of substrates; forming, on the lead frame, a housing frame comprising a group of housings that are adjacent to respective housings of the group of housings, in which the housings comprise respective cavities, and in which top portions of the respective housings comprise respective groups of slot openings; attaching, within the respective cavities, optoelectronic chips to the respective substrates; attaching wires between the optoelectronic chips and respective portions of the respective substrates to electrically couple the optoelectronic chips to the respective portions; laminating an encapsulant sheet comprising a pliable material to the housing frame, in which the laminating comprises filling the respective cavities and the slot openings with the pliable material; and dicing the SMT optoelectronic devices into discrete SMT optoelectronic devices.

In yet other embodiment(s), the forming of the housing frame further comprises: separating, via sawing, the respective portions of the respective substrates into respective pairs of substrates, in which the sawing creates respective gaps between the respective pairs of substrates, and in which each pair of substrates of the respective pairs of substrates corresponds to an SMT optoelectronic device of the SMT optoelectronic devices.

In embodiment(s), the forming of the housing frame further comprises molding, via an applied defined pressure and an applied defined heat, the housing frame using at least one of a pellet based material or a plastic based material.

Referring now to FIGS. 1-8, various embodiments disclosed herein can improve LED-based device performance, e.g., with respect to LED color, LED brightness, and/or LED light emission, by including slots in a top portion of a housing of a corresponding LED package, and filling the slots and a cavity of the housing with a laminated encapsulant material to improve adhesion of such material to the housing, and in turn prevent and/or reduce cracks, deformation, delamination, separation, and/or loss of electrical contact(s) of the LED package, e.g., associated with stress that has been applied to the LED package.

FIG. 1 illustrates a block diagram (100) of top and side views of an SMT optoelectronic device (101), in accordance with various example embodiments. A substrate (102) comprises respective portions comprising electrical terminals (106, 108) that facilitate attachment and electrical coupling of the SMT optoelectronic device to a printed circuit board (not shown). In embodiment(s), the substrate comprises a metal, e.g., copper, a metal alloy, or other conductive material(s).

The housing comprises an opaque material and a cavity (110). In embodiment(s), the opaque material comprises a reflective plastic. In other embodiment(s), the housing has been formed, via an applied defined pressure and an applied defined heat, from a material, e.g., a plastic and/or a pellet based material.

The substrate is positioned at a bottom portion of the cavity, and a top portion of the housing comprises slots corresponding to a group of slot openings (112, 114, 116, 118) that are diagonal and located at corners of the housing.

In embodiment(s), the slot openings have a width of approximately 0.1 mm to 0.5 mm, e.g., within a defined tolerance of 0.01 mm. In other embodiment(s), the slots have a depth from the top portion of the housing between ½ of a height of the cavity to ⅕ the height of the cavity, e.g., within a defined tolerance of 0.01 mm.

An optoelectronic chip (120) (e.g., photoemitter, photodetector) is electrically connected, via wires (126, 128), to the electrical terminals, and is mounted, within the cavity, to the substrate. In embodiment(s) (not shown), more than one optoelectronic chip can be mounted within the cavity and connected to the electrical terminals.

An encapsulant material (122), e.g., a laminated encapsulant material, that is translucent or transparent is included and/or formed in the cavity and the slot openings—the encapsulant material being translucent or transparent so that optical radiation can be transmitted or received via the encapsulant material. In embodiment(s), the encapsulant material is aligned with the top portion of the housing. In other embodiment(s), the encapsulant material is formed 0.01 mm to 0.1 mm above the top portion of the housing, e.g., within a defined error tolerance of 0.001 mm.

In embodiment(s), the encapsulant material is formed, via a sheet lamination process, in the cavity and the slot openings. In this regard, in various embodiment(s), the encapsulant material comprises a sheet of pliable material that has been softened, e.g., via heat, into a viscous material that fills the group of slot openings and the cavity, and then hardened during the sheet lamination process, e.g., via a curing process corresponding to a defined heat and/or a defined pressure that has been applied to the SMT optoelectronic devices.

In other embodiment(s), the encapsulant material is within a defined tolerance of a preferred distance from the top portion of the housing.

In embodiment(s), the slot openings correspond to a defined slot depth from the top potion of the housing, and correspond to a defined slot width. In this regard, in embodiment(s), the defined slot depth is within a defined tolerance of a preferred slot depth that is one half of a depth of the housing. In other embodiment(s), the defined slot depth is within a defined tolerance of a preferred slot depth that is one fifth of a depth of the housing.

In other embodiment(s), the defined slot width is within a defined tolerance of a preferred slot width that is 0.1 mm. In yet other embodiment(s), the defined slot width is within a defined tolerance of a preferred slot width that is 0.5 mm.

Figure 2:
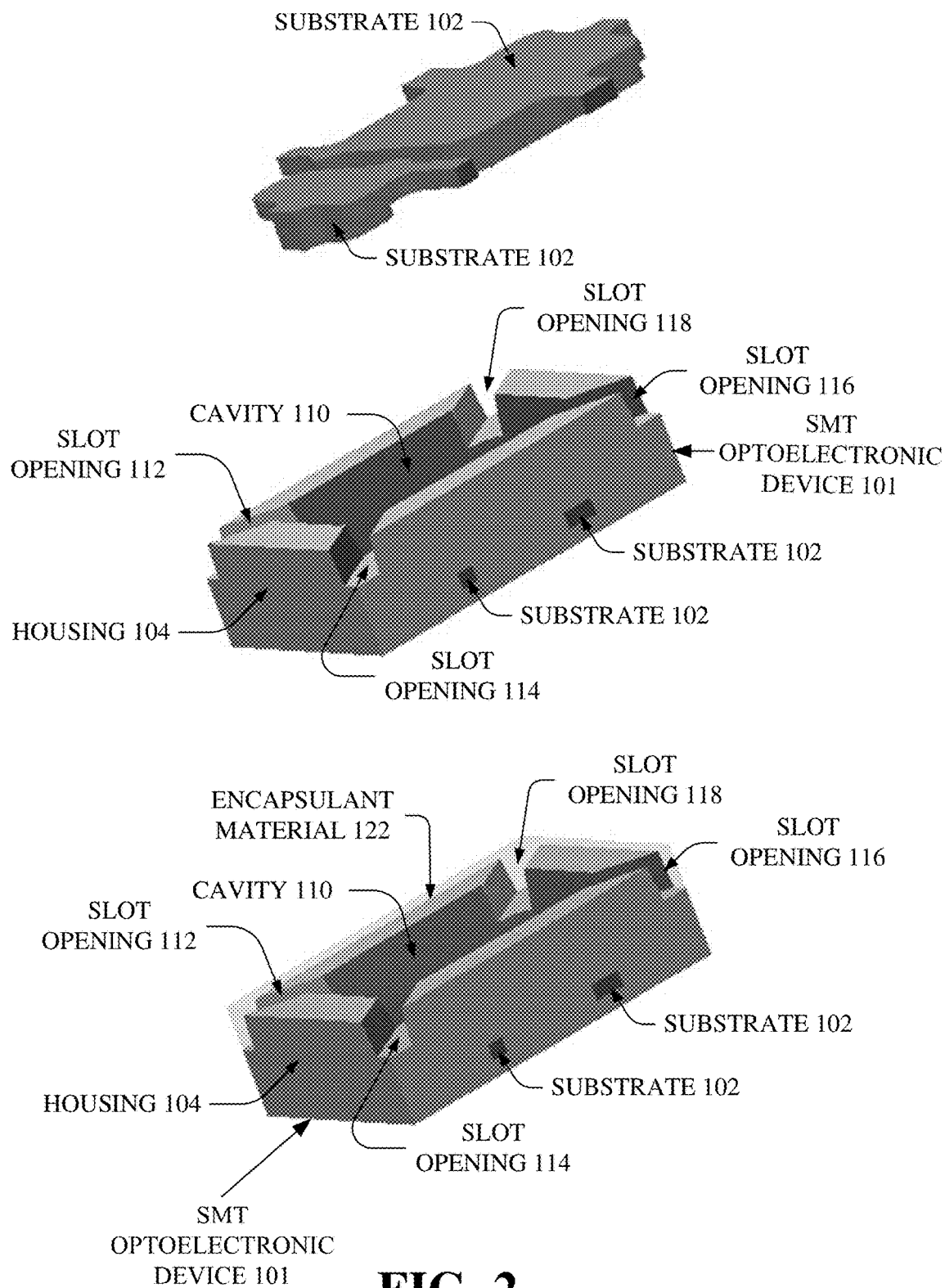
FIG. 2 illustrates a block diagram of respective views of portions of a substrate of an SMT optoelectronic device, a housing of the SMT optoelectronic device comprising slots at corners of the housing, and a cavity within the housing and the slots being filled with a laminated encapsulant material, in accordance with various example embodiments.

FIG. 2 illustrates a block diagram (200) of a first view of portions of a substrate of the SMT optoelectronic device (101), a second view of a housing (104) of the SMT optoelectronic device comprising slots corresponding to a group of slot openings (112, 114, 116, and 118) being diagonal and located at corners of the housing, and a third view of the slots and a cavity (110) of the housing being filled with an encapsulant material (122), e.g., a laminated encapsulant material.

In this regard, in various embodiment(s) disclosed herein, the encapsulant material is laminated via a lamination process in which multiple layers, e.g., comprising the substrate, the housing, and the encapsulant material, are formed on and/or attached to respective layers of the multiple layers to obtain a composite structure comprising a group of SMT optoelectronic devices comprising the SMT optoelectronic device. (See, e.g., FIGS. 5-9 and related descriptions below).

Figure 3:
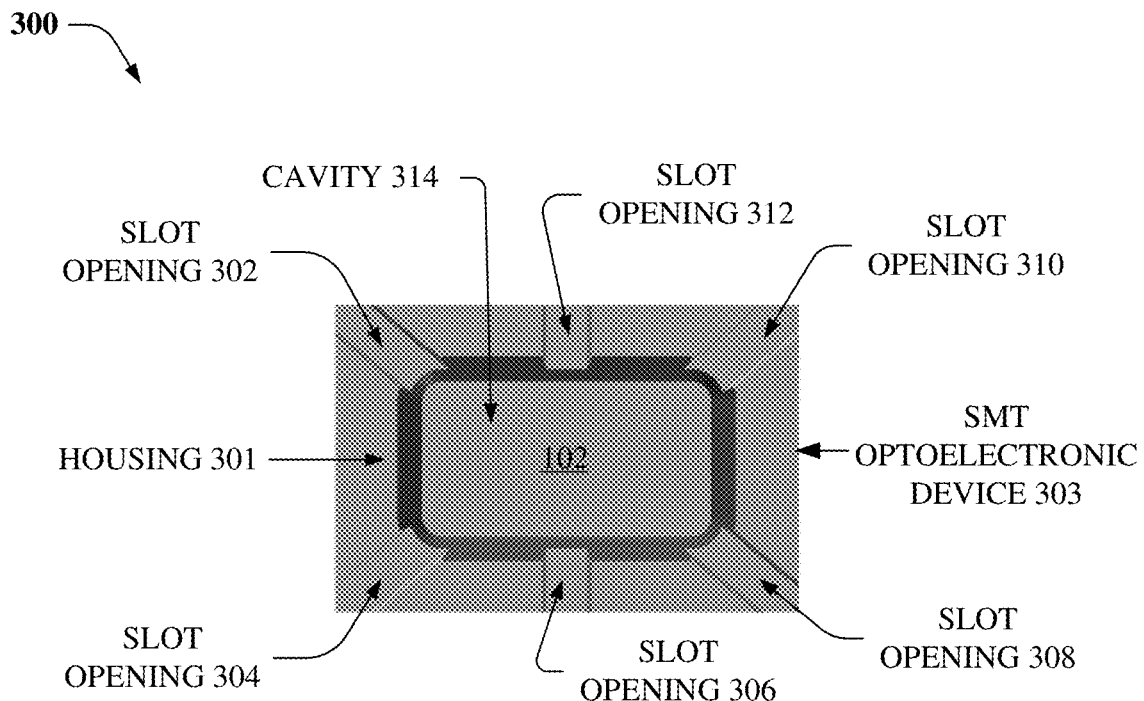
FIG. 3 illustrates a block diagram of a top view of a housing of an SMT optoelectronic device in which slots are included at corners of the housing and two sides of the housing, and an angled view of the SMT optoelectronic device in which a cavity of the housing and the slots are filled with a laminated encapsulant material, in accordance with various example embodiments.
Figure 3:
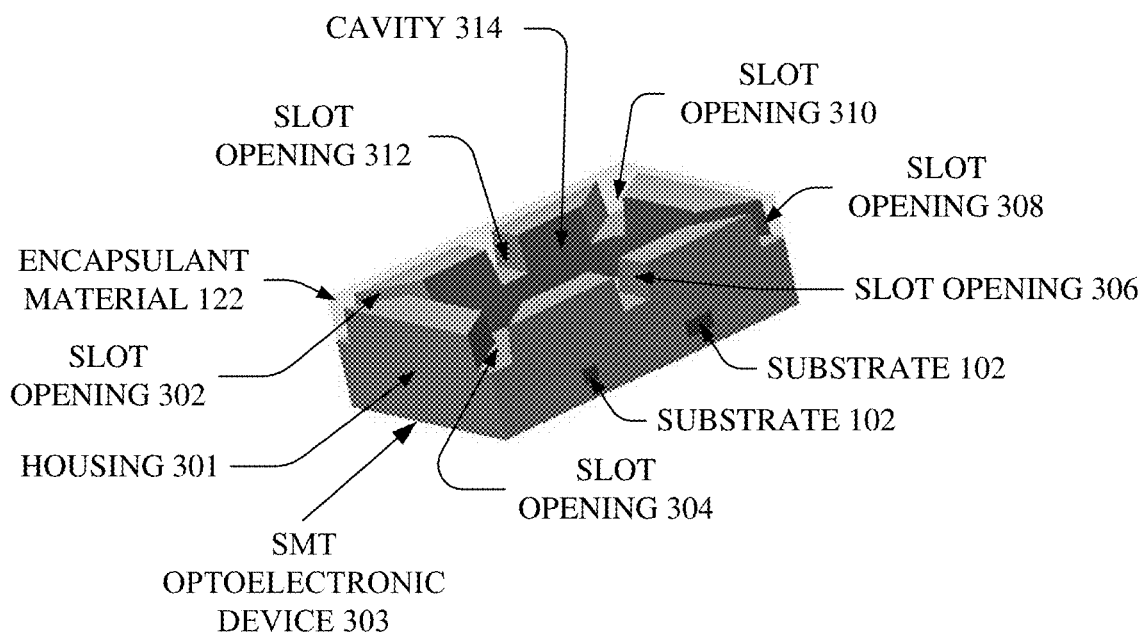

FIG. 3 illustrates a block diagram (300) of a top view of a housing (301) of an SMT optoelectronic device (303) and an angled view of the SMT optoelectronic device. As illustrated by the top and angled views, the housing of the SMT optoelectronic device includes slots corresponding to a group of slot openings (302, 304, 306, 308, 310, 312), in which a first portion of the slot openings (302, 304, 308, 310) are diagonal and located at corners of the housing, and a second portion of the slot openings (306, 312) are located at opposite sides of the housing, e.g., perpendicular to respective sides of the housing. Further, as illustrated by the angled view of the SMT optoelectronic device, the slots and a cavity (314) of the housing are filled with an encapsulant material (122), e.g., a laminated encapsulant material.

Figure 4:
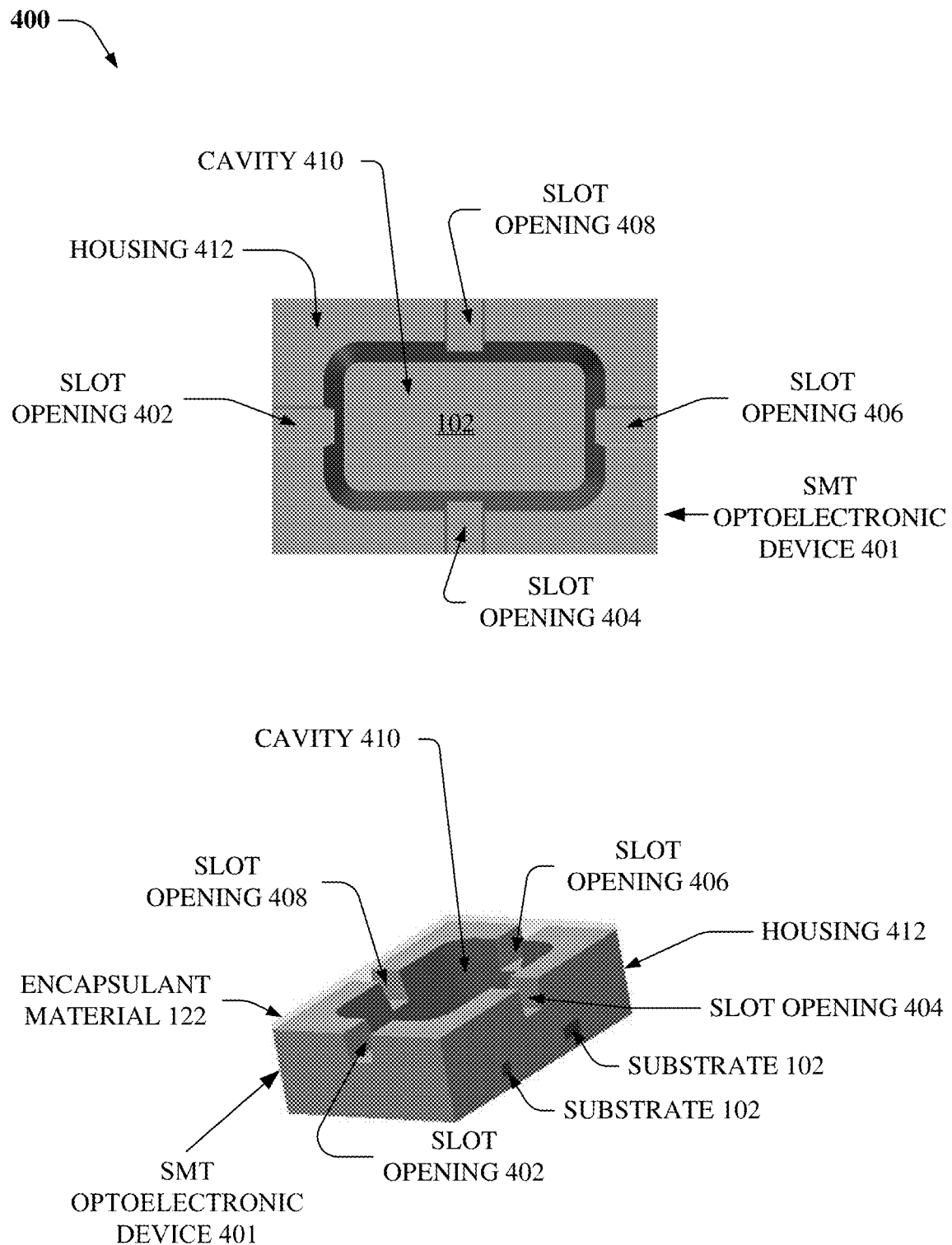
FIG. 4 illustrates a block diagram of a top view of a housing of an SMT optoelectronic device in which slots are included at four sides of the housing, and an angled view of the SMT optoelectronic device in which a cavity of the housing and the slots are filled with a laminated encapsulant material, in accordance with various example embodiments.
Figure 5:
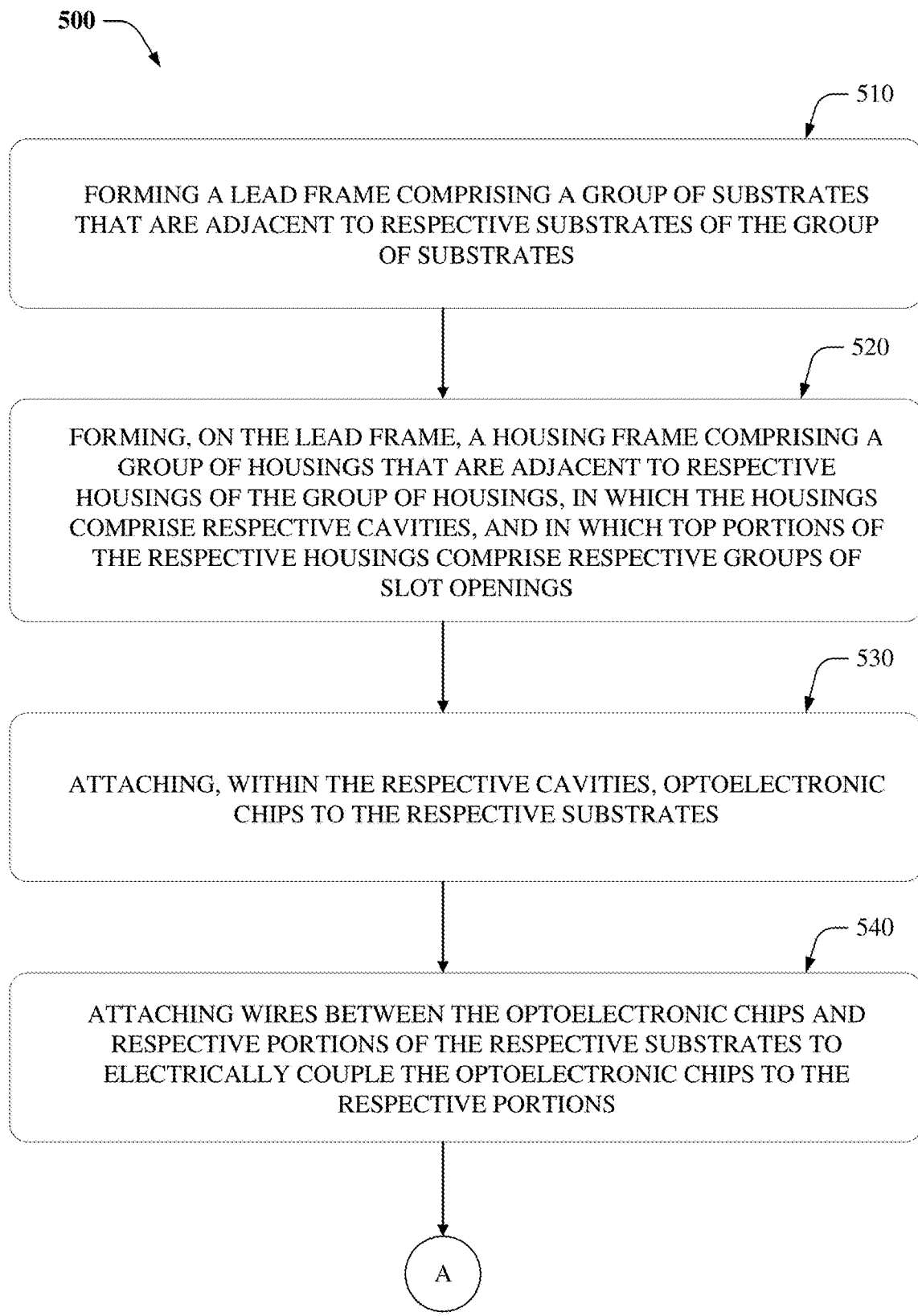
Figure 6:
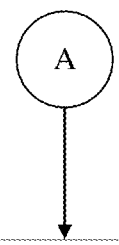
Figure 6:
Figure 8:
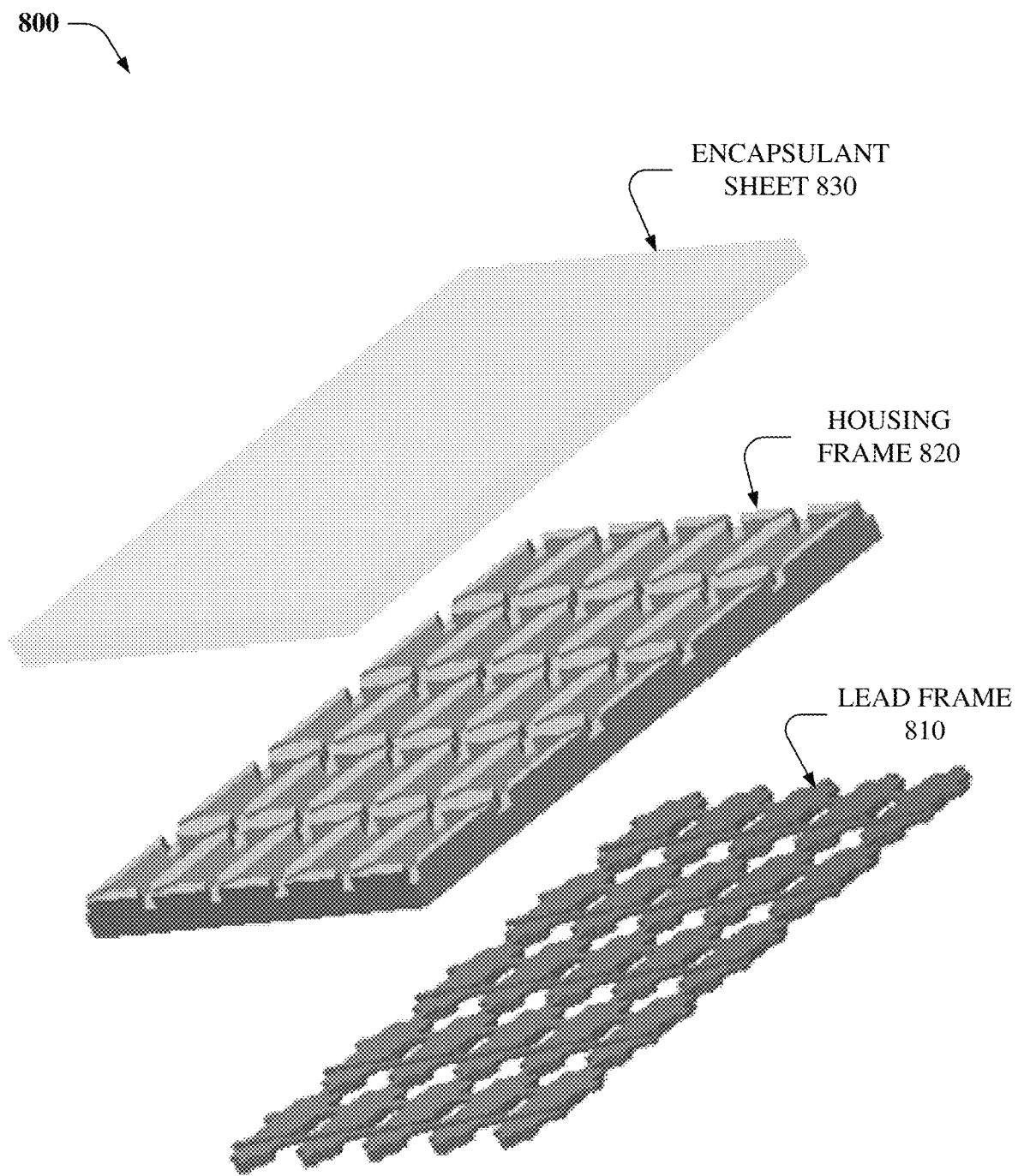
FIG. 8 illustrates a block diagram of angled views of respective layers comprising a lead frame comprising a group of substrates, a housing frame comprising a group of housings, and an encapsulant sheet of an encapsulant material—the respective layers used to obtain, via a lamination process, a composite structure comprising a group of optoelectronic devices, in accordance with various example embodiments.
Figure 9:
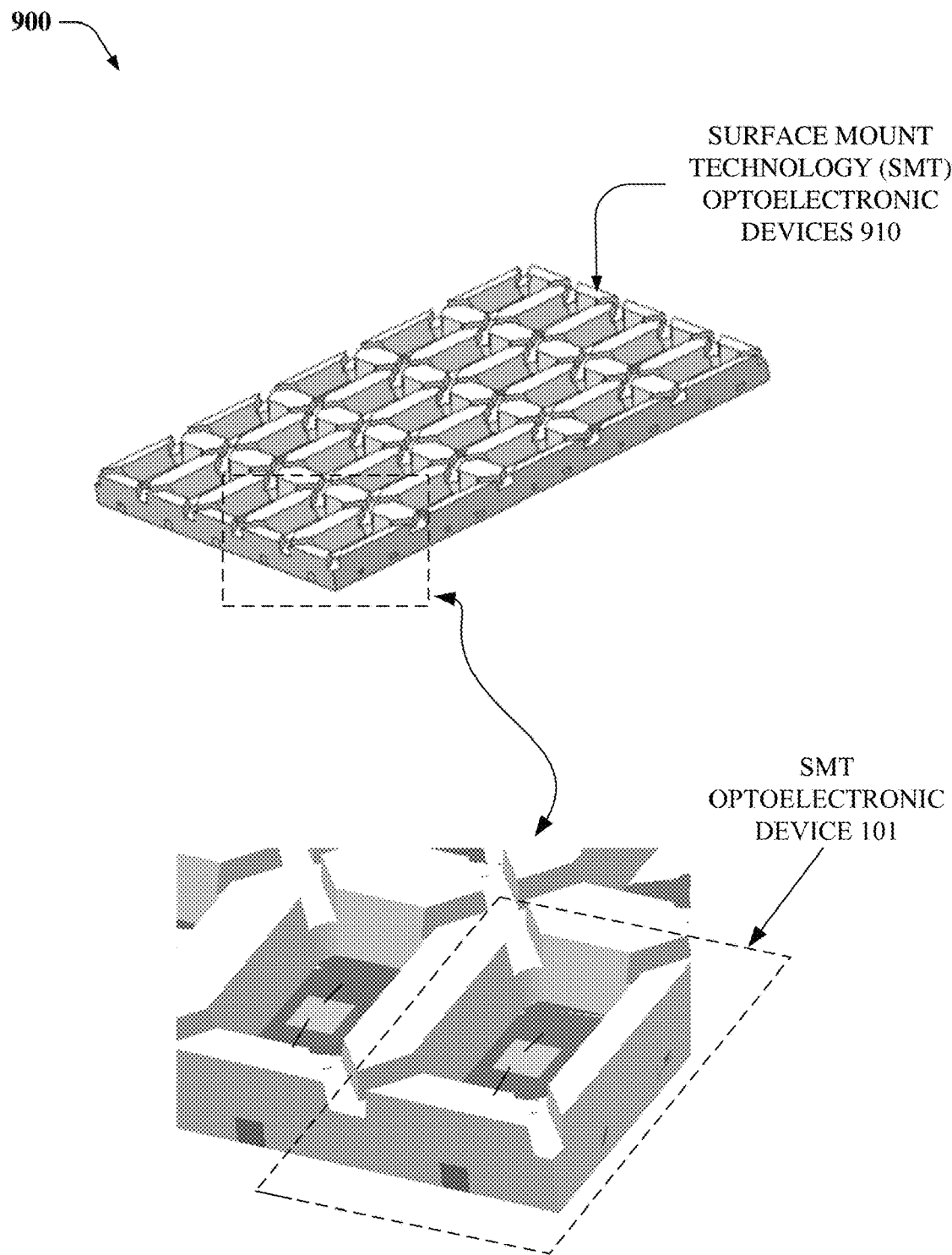
FIG. 9 illustrates a block diagram of an angled view of a composite structure, comprising a group of SMT optoelectronic devices, that has been formed via a lamination process, and a portion of the group of SMT optoelectronic devices comprising an SMT optoelectronic device, in accordance with various example embodiments.

FIG. 4 illustrates a block diagram (400) of a top view of a housing (412) of an SMT optoelectronic device (401) and an angled view of the SMT optoelectronic device. As illustrated by the top and angled views, the housing of the SMT optoelectronic device includes slots corresponding to a group of slot openings (402, 404, 406, 408) that are located at opposite sides of the housing, e.g., perpendicular to respective sides of the housing. Further, as illustrated by the angled view of the SMT optoelectronic device, the slots and a cavity (410) of the housing are filled with an encapsulant material (122), e.g., a laminated encapsulant material.

It should be appreciated by a person of ordinary skill in the art of LED package design with respect to various embodiment(s) described herein, other variations of slots can be included in any areas of the top portion of housing and filled with the laminated encapsulant material, e.g., more than one slot opening of the group of slot openings can be included in a top portion of respective sides of the housing, in addition to, or without, diagonal slot openings being included in corners of the top portion of the housing.

Referring now FIGS. 5-9, a method of manufacturing a group of SMT optoelectronic devices (810) via a lamination process; a block diagram of angled views of respective layers comprising a lead frame comprising a group of substrates, a housing frame comprising a group of housings, and an encapsulant sheet of an encapsulant material that are formed and/or attached to the respective layers via the lamination process to obtain a composite structure comprising the group of SMT optoelectronic devices; and a block diagram of an angled view of the composite structure and a portion of the group of SMT optoelectronic devices comprising an SMT optoelectronic device are illustrated, respectively, in accordance with various example embodiments.

At 510, a lead frame (810) comprising a group of substrates that are adjacent to respective substrates of the group of substrates is formed. In embodiment(s), the lead frame comprises a metal, e.g., copper, a metal alloy, or other conductive material(s).

At 520, a housing frame (820), e.g., comprising an opaque material, is formed on the lead frame. In embodiment(s), the housing is formed, via an applied defined pressure and an applied defined heat, from a pellet based and/or a plastic material. The housing frame comprises a group of housings that are adjacent to respective housings of the group of housings, the housings comprise respective cavities, and top portions of the respective housings comprise respective groups of slot openings.

In embodiment(s), the slot openings correspond to a defined slot depth from a top potion of the housing frame, and correspond to a defined slot width. In this regard, in other embodiment(s), the defined slot depth is within a defined tolerance of a preferred slot depth that is one half of a depth of the housing frame. In yet other embodiment(s), the defined slot depth is within a defined tolerance of a preferred slot depth that is one fifth of a depth of the housing frame. In other embodiment(s), the defined slot width is within a defined tolerance of a preferred slot width that is 0.1 mm. In yet other embodiment(s), the defined slot width is within a defined tolerance of a preferred slot width that is 0.5 mm.

At 530, optoelectronic chips (e.g., 120) are attached and/or mounted, within the respective cavities, to the respective substrates. In embodiment(s) (not shown), more than one optoelectronic chip can be attached and/or mounted within a cavity of the respective cavities.

At 540, wires are attached between the optoelectronic chips and respective portions of the respective substrates to electrically couple the optoelectronic chips to the respective portions—the respective portions comprising electrical terminals that facilitate attachment and electrical coupling of respective SMT optoelectronic devices of the SMT optoelectronic device to respective printed circuit boards (not shown). In embodiment(s) (not shown) that include more than one optoelectronic chip that is attached and/or mounted within a cavity of the respective cavities, the optoelectronic chips are electrically coupled to the respective portions of the respective substrates using wires attached between the optoelectronic chips and the respective portions.

At 610, an encapsulant sheet (830) comprising an encapsulant material (e.g., a pliable material, a translucent material) is laminated, via a lamination process, to the housing frame. The lamination process comprises forming and/or attaching the encapsulant sheet to the housing frame, and filling the respective cavities and the slot openings with the encapsulant material. In this regard, in embodiment(s), the encapsulant sheet is softened, e.g., via heat, into a viscous material that fills the respective groups of slot openings and the respective cavities, and then hardened during the lamination process, e.g., via a curing process corresponding to a defined heat and/or a defined pressure that has been applied to the SMT optoelectronic devices (910).

In embodiment(s), the encapsulant sheet is aligned with the top portion of the housing frame. In other embodiment(s), the encapsulant sheet is formed 0.01 mm to 0.1 mm above the top portion of the housing frame, e.g., within a defined error tolerance of 0.001 mm. In other embodiment(s), the encapsulant sheet is within a defined tolerance of a preferred distance from the top portion of the housing frame.

At 620, the SMT optoelectronic devices (810), e.g., as a composite structure, are diced into discrete SMT optoelectronic devices, e.g., SMT optoelectronic device 101. (See, e.g., FIG. 8).

In embodiment(s) illustrated by FIG. 7 corresponding to the forming of the housing frame, at 710, the respective portions of the respective substrates are separated, via sawing, into respective pairs of substrates—the sawing creating respective gaps between the respective pairs of substrates, and each pair of substrates of the respective pairs of substrates corresponds to an SMT optoelectronic device of the SMT optoelectronic devices.

Reference throughout this specification to "one embodiment," or "an embodiment," means that a particular feature, structure, or characteristic described in connection with the embodiment is included in at least one embodiment. Thus, the appearances of the phrase "in one embodiment," or "in an embodiment," in various places throughout this specification are not necessarily all referring to the same embodiment. Furthermore, the particular features, structures, or characteristics may be combined in any suitable manner in one or more embodiments.

Further, to the extent that the terms "includes," "has," "contains," and other similar words are used in either the detailed description or the appended claims, such terms are intended to be inclusive—in a manner similar to the term "comprising" as an open transition word—without precluding any additional or other elements. Moreover, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Furthermore, the word "exemplary" and/or "demonstrative" is used herein to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent exemplary structures and techniques known to those of ordinary skill in the art having the benefit of the instant disclosure.

The above description of illustrated embodiments of the subject disclosure is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. A surface mount technology (SMT) optoelectronic device, comprising:
    a substrate comprising electrical terminals that facilitate attachment and electrical coupling of the SMT optoelectronic device to a printed circuit board;
    a housing comprising an opaque material and a cavity, wherein the substrate is positioned at a bottom portion of the cavity, and wherein a top portion of the housing comprises a group of slot openings that open into the cavity and extend from an interior of the housing to an exterior of the housing;
    at least one optoelectronic chip that is
        electrically connected to the electrical terminals, and
        mounted, within the cavity, to the substrate; and
    an encapsulant material that is translucent or transparent and that has been included in the cavity and the slot openings.

2. The SMT optoelectronic device of claim 1, wherein the housing has been formed, via an applied defined pressure and an applied defined heat, from a pellet based material.

3. The SMT optoelectronic device of claim 1, wherein the encapsulant material has been formed, via a sheet lamination process, in the cavity and the slot openings.

4. The SMT optoelectronic device of claim 3, wherein the encapsulant material comprises a sheet of pliable material that has been hardened, via a curing process corresponding to at least one of an applied heat or an applied pressure, during the sheet lamination process.

5. The SMT optoelectronic device of claim 1, wherein at least a portion of the slot openings are diagonal and located at corners of the housing.

6. The SMT optoelectronic device of claim 1, wherein the encapsulant material is within a defined tolerance of a preferred distance from the top portion of the housing.

7. The SMT optoelectronic device of claim 1, wherein the slot openings correspond to a defined slot depth from the top potion of the housing, and wherein the slot openings correspond to a defined slot width.

8. The SMT optoelectronic device of claim 7, wherein the defined slot depth is within a defined tolerance of a preferred slot depth that is one half of a depth of the housing.

9. The SMT optoelectronic device of claim 7, wherein the defined slot depth is within a defined tolerance of a preferred slot depth that is one fifth of a depth of the housing.

10. The SMT optoelectronic device of claim 7, wherein the defined slot width is within a defined tolerance of a preferred slot width that is one-tenth of a millimeter.

11. The SMT optoelectronic device of claim 7, wherein the defined slot width is within a defined tolerance of a preferred slot width that is five-tenths of a millimeter.

12. The SMT optoelectronic device of claim 1, wherein the at least one optoelectronic chip comprises a photoemitter or a photodetector.

13. The SMT optoelectronic device of claim 1, wherein the slot openings facilitate a reduction of an effect, on the SMT optoelectronic device, of an external stress that has been applied to the SMT optoelectronic device by at least one of releasing the external stress via the slot openings or improving an adhesion of the encapsulant material to the housing.

14. The SMT optoelectronic device of claim 13, wherein the external stress comprises a temperature that has been applied to the SMT optoelectronic device.

15. The SMT optoelectronic device of claim 13, wherein the external stress comprises a movement that has been applied to the SMT optoelectronic device.

16. The SMT optoelectronic device of claim 13, wherein the external stress comprises a force that has been applied to the SMT optoelectronic device.

17. The SMT optoelectronic device of claim 13, wherein the external stress comprises a strain that has been applied to the SMT optoelectronic device.

18. The SMT optoelectronic device of claim 13, wherein the slot openings that open into the cavity comprise respective orifices of the cavity.

19. The SMT optoelectronic device of claim 1, wherein the housing has been formed, via an applied defined pressure and an applied defined heat, from a plastic material.

20. The SMT optoelectronic device of claim 1, wherein the SMT optoelectronic device comprises a discrete SMT optoelectronic device that has been separated from a group of SMT optoelectronic devices comprising the discrete SMT optoelectronic device.

* * * * *